(12) United States Patent
Kanemaru et al.

(10) Patent No.: US 7,926,987 B2
(45) Date of Patent: Apr. 19, 2011

(54) ELECTRONIC APPARATUS WITH LIGHT EMITTING DIODE

(75) Inventors: Yasuhisa Kanemaru, Fukuoka (JP); Takahisa Yoshizumi, Fukuoka (JP); Haruki Hirata, Fukuoka (JP); Mitsuru Etou, Fukuoka (JP); Makoto Kawakami, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 193 days.

(21) Appl. No.: 12/003,772

(22) Filed: Dec. 31, 2007

(65) Prior Publication Data

US 2008/0192495 A1 Aug. 14, 2008

(30) Foreign Application Priority Data

Feb. 8, 2007 (JP) ................................ 2007-029526

(51) Int. Cl.
*F21V 17/00* (2006.01)
(52) U.S. Cl. .................... 362/375; 362/362; 362/133
(58) Field of Classification Search .................. 362/375, 362/125, 97.3, 362, 126, 249.02, 373, 133
See application file for complete search history.

(56) References Cited

U.S. PATENT DOCUMENTS

| | | | |
|---|---|---|---|
| 2004/0042211 A1* | 3/2004 | Jigamian et al. | 362/263 |
| 2006/0013016 A1* | 1/2006 | Koganezawa et al. | 362/613 |
| 2006/0067077 A1* | 3/2006 | Kumthampinij et al. | 362/294 |
| 2006/0141851 A1 | 6/2006 | Matsui et al. | |
| 2006/0262516 A9* | 11/2006 | Dowling et al. | 362/101 |
| 2006/0262533 A1* | 11/2006 | Lin et al. | 362/249 |
| 2008/0144320 A1* | 6/2008 | Tokunaga | 362/294 |
| 2008/0180940 A1* | 7/2008 | Tuan | 362/103 |

FOREIGN PATENT DOCUMENTS

| | | |
|---|---|---|
| JP | 1-165182 | 6/1989 |
| JP | 11-24608 | 1/1999 |
| JP | 2002-344150 | 11/2002 |
| JP | 2002344150 A * | 11/2002 |
| JP | 2004265626 A * | 9/2004 |
| JP | 2005-43601 | 2/2005 |

OTHER PUBLICATIONS

Office Action mailed Feb. 17, 2009 in corresponding Japanese Application No. 2007-029526 (3 pp.).
Chinese Office Action dated Feb. 25, 2010 for corresponding Chinese patent application No. 200810003060.3.

* cited by examiner

*Primary Examiner* — Diane I Lee
*Assistant Examiner* — Evan Dzierzynski
(74) *Attorney, Agent, or Firm* — Staas & Halsey LLP

(57) ABSTRACT

An electronic apparatus installed outdoors includes a cabinet body having an opening that houses components constituting the electronic apparatus, a lid body that closes the opening, a printed circuit board unit on which electronic components are mounted, and a block made from an opaque material that has a plurality of holes and is disposed between the printed circuit board unit and the lid body. The printed circuit board unit has a plurality of LED's that indicate operating states of the electronic apparatus. The lid body has a window portion covered with a transparent material having a larger area than a region where the LED's are arranged, so that the window faces the region. The block is disposed so that light emission from the plurality of LED's can be observed from the outside of the electronic apparatus through the respective plurality of holes and the window portion.

6 Claims, 11 Drawing Sheets

ELECTRONIC APPARATUS WITH LIGHT EMITTING DIODE

BACKGROUND OF THE INVENTION

1. Field of the Invention

The present invention relates to an electronic apparatus that is installed outdoors for use and is equipped with a light emitting diode for indicating a state of operation.

2. Description of the Related Art

Recently, a light emitting diode (LED) that is a type of semiconductor element that emits light by passing electric current has been rapidly expanded and continuing to become ubiquitous. Since the LED has features of long life, power saving, high luminance and the like, it is used in many electronic apparatuses for indicating a state of operation of the apparatuses.

For example, a plurality of LED's are disposed inside an apparatus so that a user can check whether or not power supply, communication and the like are normal by viewing light emission of each LED from the outside.

However, there is a case where a plurality of LED's are aligned inside an electronic apparatus, and light emission of a LED leaks into a neighboring LED. In this case, when a user views them from the outside of the apparatus, it is difficult to tell which LED emits light depending on a state of ambient light.

Therefore, a technique is proposed for preventing the light emission leak of LED's by disposing a component as a light shield between neighboring LED's of the plurality of LED's.

For example, Japanese unexamined patent publication No. 01-165182 discloses a light emitting diode display device having a structure including a lens guiding light from a plurality of LED and light shield walls disposed so as to penetrate the lens, so that each light emission is shielded by the light shield wall between neighboring LED's.

Japanese unexamined patent publication No. 11-024608 discloses an LED display device having a structure including light guide pipes, for individual LED's, made of a light guide member and a light shield member, the light guide pipes being coupled to each other and disposed between the LED and a display surface, so that light emission leak is prevented between neighboring LED's.

In addition, a conventional electronic apparatus with LED's is proposed as follows, which is a base station apparatus installed outdoors for use in mobile communication.

FIG. 11 is a cross section showing an inner structure of a conventional base station apparatus 9 at the vicinity of the bottom surface.

The base station apparatus 9 includes a cabinet body 93, a lid body 94, a printed circuit board unit 95, a sub circuit board unit 96, and a variety of other components.

The cabinet body 93 includes a peripheral wall like a rectangular cylinder and a bottom plate portion (not shown) that is fixed to one opening portion of the peripheral wall. The cabinet body 93 houses the printed circuit board unit 95, the sub circuit board unit 96 and a variety of other components constituting the base station apparatus 9.

The printed circuit board unit 95 has various electronic components such as an LSI (or a semiconductor integrated circuit element, not shown) on its surface and is fixed to the cabinet body 93 with a mounting bracket 102.

The sub circuit board unit 96 has LED's 97 on its surface and is fixed to the cabinet body 93 with a mounting bracket 103. The sub circuit board unit 96 is connected electrically to the printed circuit board unit 95 via a wiring cable 104. Each of the LED's 97 is covered with an opaque plastic component 105 having a cylindrical shape.

The lid body 94 is formed in a plate having a rectangular shape viewed from the front and fixed with screws (not shown) so as to close an opening of the cabinet body 93. The lid body 94 has a display panel 98. The display panel 98 is provided for checking light emission of the LED's 97 from the outside of the base station apparatus 9.

Note that the sub circuit board unit 96 is disposed separately from the printed circuit board unit 95 in order to dispose the LED's 97 close to the display panel 98 so that visibility of light emission of the LED's 97 can be improved.

The display panel 98 has a plate-like body 106 and a pressing member 107. The plate-like body 106 is made from transparent acrylic and covers an opening hole 108 formed in the lid body 94. The pressing member 107 is disposed in contact with a surface of the plate-like body 106 and attached to the lid body 94 with screws (not shown) so as to press the plate-like body 106. The pressing member 107 has a plurality of holes 109 for guiding light from the LED's 97 individually, in accordance with the number of LED's 97.

In this example, the plastic components 105 covering the LED's 97 and the holes 109 formed in the pressing member 107 of the display panel 98 guide light from the individual LED's 97 with the light prevented from being diffused, so that light of the LED's 97 are displayed individually on the surface of the lid body 94.

According to this structure, light emission of the LED's 97 disposed inside the base station apparatus 9 can be viewed externally.

However, the conventional electronic apparatus equipped with LED's described above needs, like the base station apparatus 9 shown in FIG. 11, not only the printed circuit board unit and the LED's but also the plastic component for preventing diffusion of light emission, the sub circuit board unit, the mounting bracket of the sub circuit board unit, the wiring cable between the printed circuit board unit and the sub circuit board unit, and the like. Therefore, there is a problem that the structural components increase and the structure inside the apparatus becomes complicated.

This problem probably occurs similarly in the case where the light emitting diode display device disclosed in Japanese unexamined patent publication No. 01-165182 is used for the electronic apparatus.

In addition, the base station apparatus or the like for mobile communication is often installed outdoors, so it is required to have a structure of sealed cabinet where water proofing property is considered. Therefore, there is a problem that accumulation of tolerances of individual components and attachment errors thereof may cause difficulty in matching positions of individual LED's with positions of corresponding holes formed in the display panel on the surface of the cabinet for registration. In addition, there is another problem that the sealed structure makes it difficult to correct the attachment position after the cabinet is sealed.

This problem probably occurs similarly in the case where the LED display device disclosed in Japanese unexamined patent publication No. 11-024608 is used for the electronic apparatus.

SUMMARY OF THE INVENTION

An object of the present invention is to provide an electronic apparatus that can reduce the number of components constituting the apparatus and facilitate registration between the LED's and the display panel.

An electronic apparatus according to an embodiment of the present invention is an electronic apparatus that is installed outdoors for use, which includes a cabinet body having an opening that houses components constituting the electronic apparatus, a lid body that closes the opening, a printed circuit board unit on which electronic components necessary for operation of the electronic apparatus are mounted, the printed circuit board unit being disposed in the cabinet body so that a surface thereof faces the lid body, and a block made from an opaque material with a plurality of holes, the block being disposed between the printed circuit board unit and the lid body. The printed circuit board unit is provided with a plurality of light emitting diodes arranged on the surface thereof for indicating operating states of the electronic apparatus, the lid body is provided with a window portion covered with a transparent material having a larger area than a region on the printed circuit board unit where the plurality of light emitting diodes are arranged, so that the window portion faces the region, and the block is disposed so that light emission of the plurality of light emitting diodes can be viewed through the respective plurality of holes and the window portion from an outside of the electronic apparatus.

Therefore, light emission of the light emitting diodes can be guided to the outside of the electronic apparatus without using a new printed circuit board unit.

Preferably, the printed circuit board unit may have a semiconductor integrated circuit element for performing control of the electronic apparatus on the surface of the printed circuit board unit, and the block may be made from a metal material and provided integrally with a heat conducting portion for transmitting heat generated by the semiconductor integrated circuit element to the lid body for cooling that contacts intimately the semiconductor integrated circuit element and the lid body.

Therefore, the semiconductor integrated circuit element provided in the electronic apparatus can be cooled by using the block for guiding light emission of the light emitting diodes.

Preferably, the window portion may have a seal member for preventing water from entering, a plate-like body made from the transparent material and a frame-like pressing member. The seal member may be disposed around an opening hole provided at the lid body, the plate-like body may cover the opening hole so as to sandwich the seal member between the plate-like body and the lid body, and the pressing member may be disposed to contact a surface of the plate-like body and may be attached to the lid body with screws so as to press and hold the plate-like body.

Therefore, while the electronic apparatus has a waterproof construction, visibility of light emission from the light emitting diode is not impaired even if some misregistration of the light emitting diode or the window portion occurs. Note that the "waterproof construction" in the present invention includes a structure having waterproof property such as a dripproof construction or a rainproof construction.

According to the present invention, the number of components of the electronic apparatus can be reduced so that registration between the light emitting diode and the display panel can be performed easily. According to the preferred embodiment of the present invention, the semiconductor integrated circuit element can be cooled at the same time.

DESCRIPTION OF THE PREFERRED EMBODIMENTS

The invention will now be described in detail with reference to the attached drawings.

Figure 1:
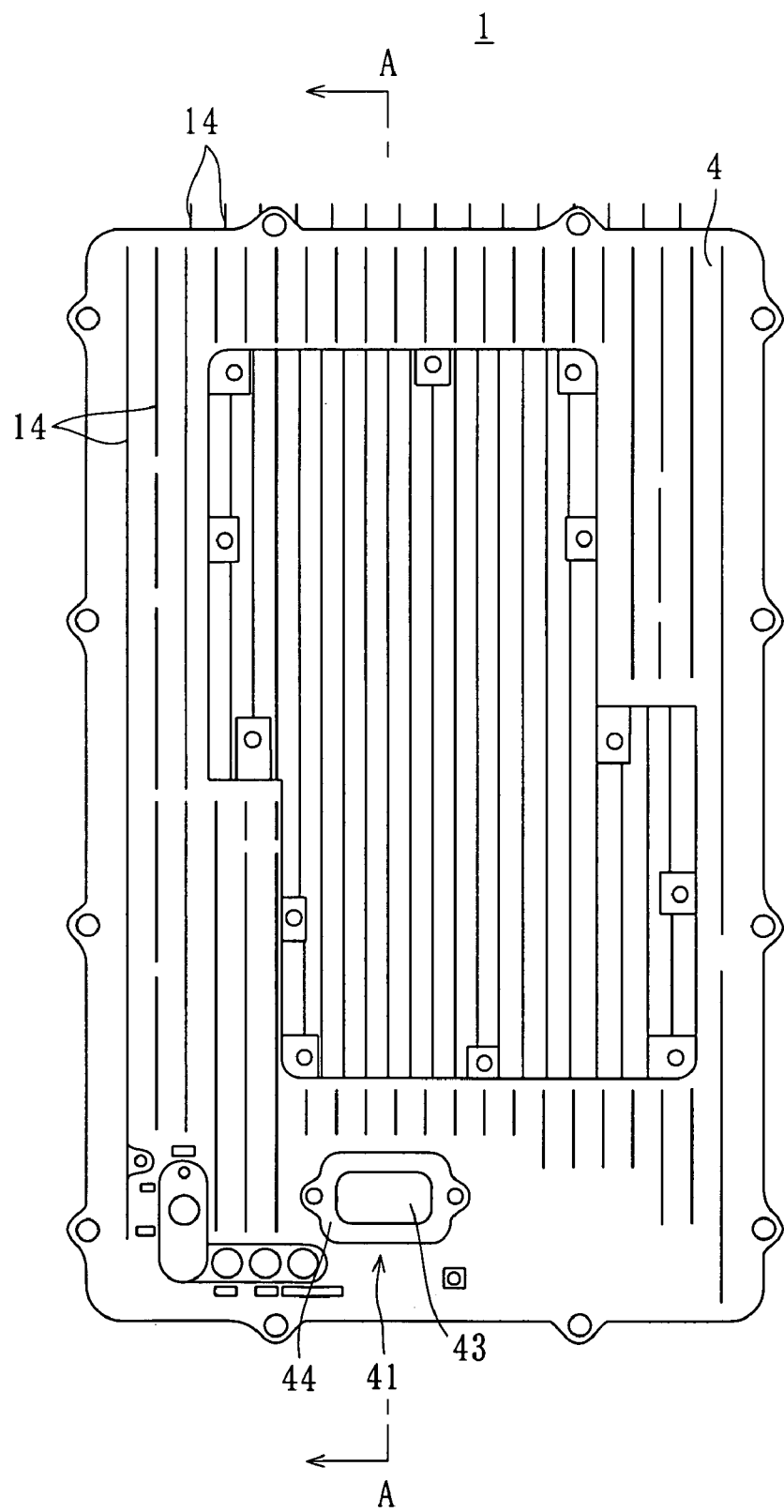
FIG. 1 is a front view of a base station apparatus according to an embodiment of the present invention.
Figure 2:
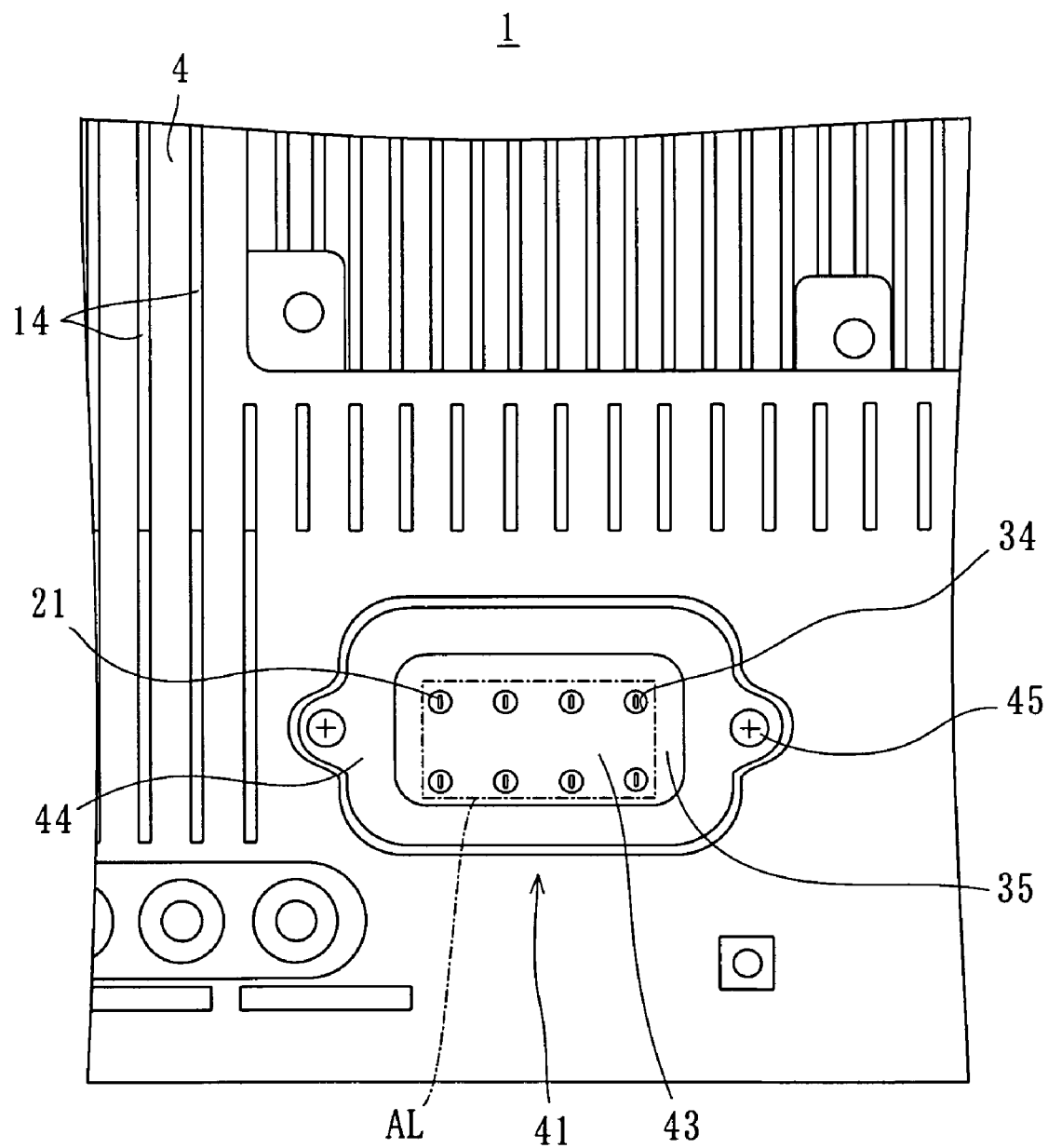
FIG. 2 is an enlarged front view of a main portion of the base station apparatus shown in FIG. 1.
Figure 3:
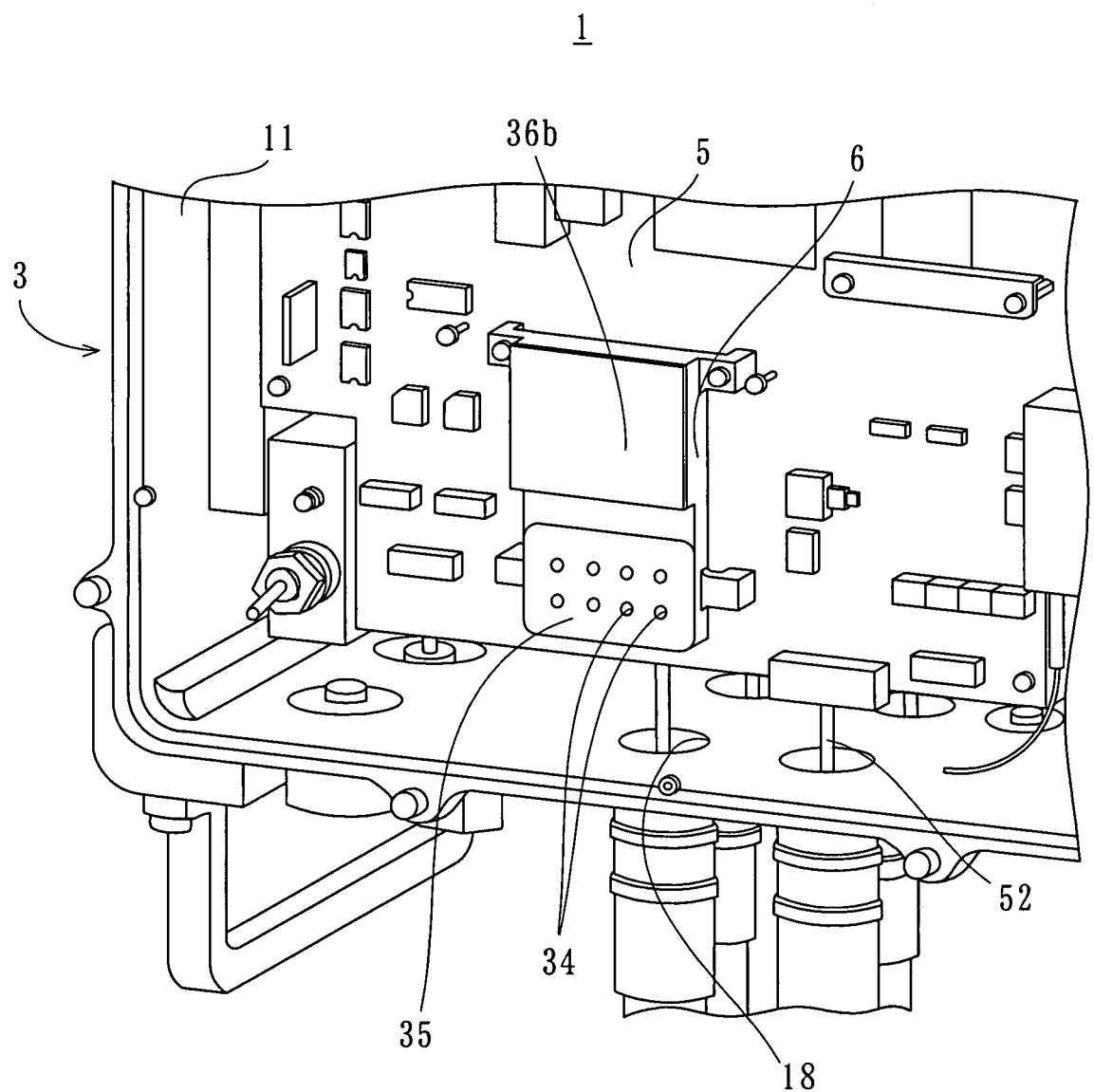
FIG. 3 is a perspective view showing inside of the base station apparatus shown in FIG. 1 at a bottom and the vicinity, in which a lid body is removed.
Figure 4:
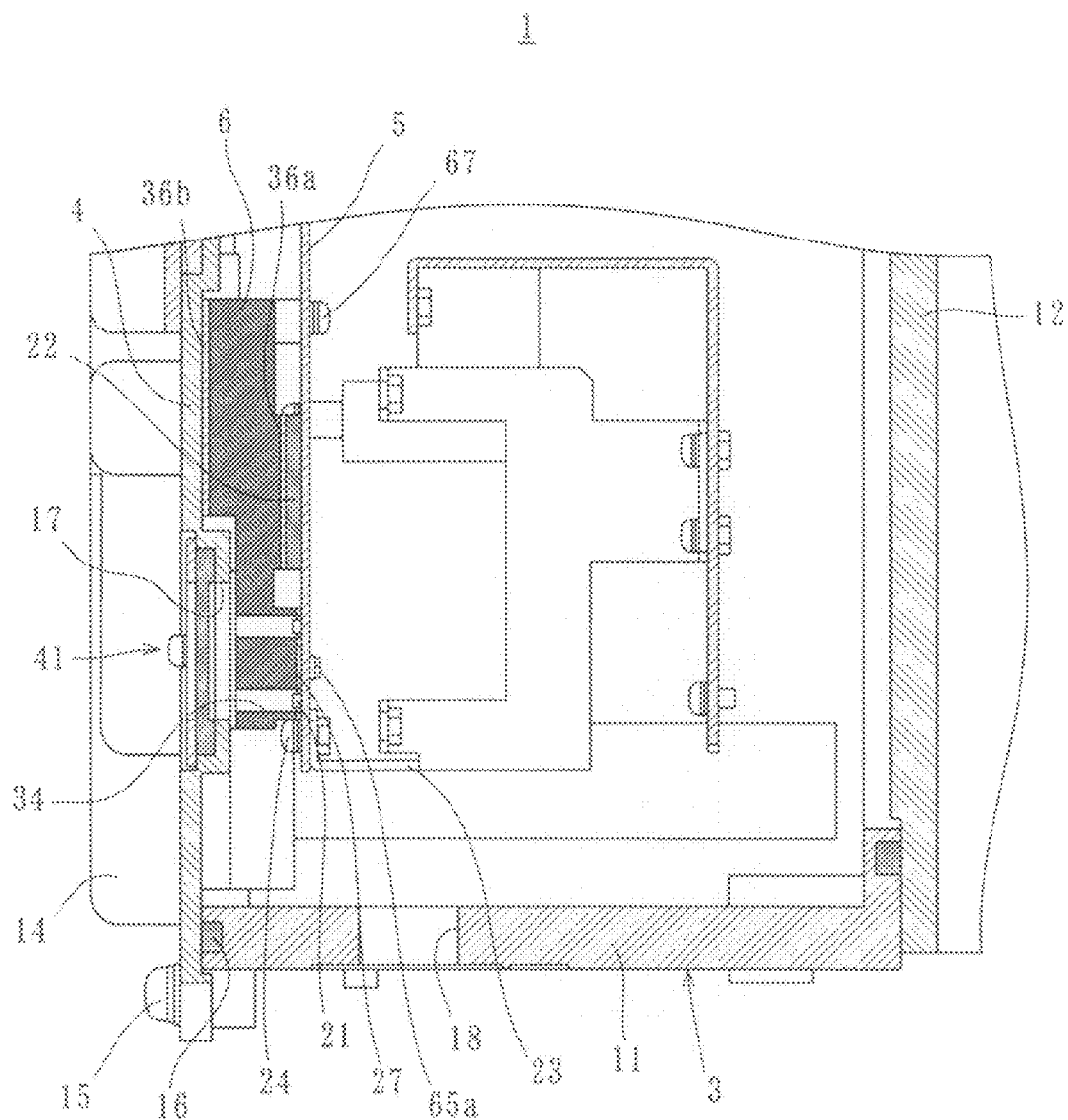
FIG. 4 is a cross section of the base station apparatus shown in FIG. 1 cut along the line A-A.
Figure 5:
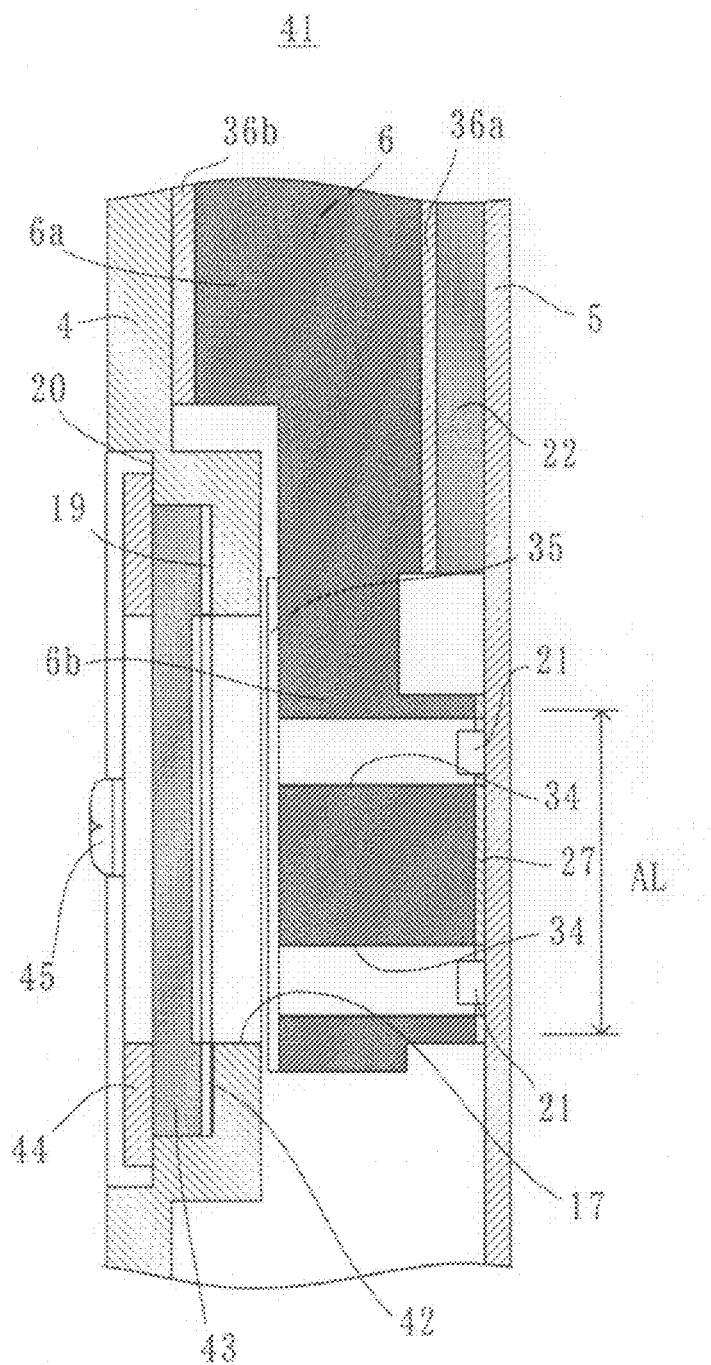
FIG. 5 is an enlarged cross section of a display panel shown in FIG. 4.

FIG. 1 is a front view of a base station apparatus (electronic apparatus) 1 according to an embodiment of the present invention, FIG. 2 is an enlarged front view of a main portion of the base station apparatus 1 shown in FIG. 1, FIG. 3 is a perspective view showing inside of the base station apparatus 1 shown in FIG. 1 at a bottom and the vicinity, in which a lid body 4 is removed, FIG. 4 is a cross section of the base station apparatus 1 shown in FIG. 1 cut along the line A-A, and FIG. 5 is a enlarged cross section of a display panel (window portion) 41 shown in FIG. 4.

The base station apparatus 1 is a base station apparatus that is used for mobile communication with mobile phones or the like and is installed outdoors for canceling blind zones, and it is connected to an optical cable 52 that is a type of a wiring cable, an AC power supply wiring cable (not shown) and the like. The base station apparatus 1 includes a cabinet body 3, the lid body 4, a printed circuit board unit 5, a block 6 and a variety of other components.

The cabinet body 3 is made from an aluminum die casting material including a peripheral wall 11 like a rectangular cylinder, to one opening of which a bottom plate portion 12 is fixed with screws (not shown). The cabinet body 3 houses the printed circuit board unit 5, the block 6 and a variety of other components that constitute the base station apparatus 1.

The lid body 4 is made from the same aluminum die casting material as the cabinet body 3. It has a shape like a rectangular plate viewed from the front, and a surface thereof is provided with fins 14 for dissipating heat inside the base station apparatus 1. The lid body 4 is fixed with screws 15 so as to seal an opening of the cabinet body 3. In addition, a rubber packing 16 is disposed between the cabinet body 3 and the lid body 4 so as to realize a waterproof construction that prevents water from entering inside.

In FIG. 4, the printed circuit board unit 5 includes a plurality of LED's (light emitting diodes) 21, an LSI (semiconductor integrated circuit element) 22 and a variety of other electronic components on the surface, and it is fixed to the cabinet body 3 with a mounting bracket 23 and screws 24. The LED 21 is a surface mounting type called a surface mount device (SMD) and indicates an operating state of the base station apparatus 1 by a light emission state of each LED 21.

As a light emission state of the LED 21, various light emission states can be set including stay on, blink, shut off, fast blink, slow blink, change of display color and the like, for example. Although the LED 21 in this embodiment has a rectangular shape viewed from the front of light emission, it may have a circular shape, a triangular shape or other shapes.

The block 6 is made from a metal material such as an aluminum alloy and has a plurality of holes 34 that pass through from the top surface to the bottom surface of the block 6 and have a circular cross section. The holes 34 are provided for guiding light emission of the LED's 21 to the top surface of the block 6, so that the light emission states of the individual LED's 21 can be observed separately through the individual holes 34. Therefore, each of the holes 34 is provided so as to correspond to the position of each LED 21. The block 6 is disposed on the surface of the printed circuit board unit 5 so that each of the LED's 21 enters each of the holes 34 and that a region AL on the printed circuit board unit 5 where the LED's 21 are arranged is covered with the block 6.

In addition, the surface of the block 6 is covered with a label 35. The label 35 is made by screen printing for example on a transparent plastic film. The print includes, for example, meanings of "POWER", "LINK", "STATUS", "BUSY", "ERROR" and the like indicated by light emission of the LED's 21. Note that it is possible to print directly on the surface of the block 6 instead of sticking the label 35 on the surface of the block 6. The direct print is also referred to as a "label" in this description.

In FIG. 4, the lid body 4 has the display panel 41. The display panel 41 is provided for viewing light emission of the LED's 21 from the outside of the base station apparatus 1, and it covers an opening hole 17 formed in the lid body 4 with a transparent material such as acrylic. The display panel 41 is disposed so as to face the region AL and has a larger area than the region AL.

In FIG. 2, since the block 6 is disposed on the region AL, the label 35 on the surface of the block 6 and light emission of the LED's 21 guided by the holes 34 can be viewed through the display panel 41 from the outside of the base station apparatus 1. Since the block 6 is made from an opaque material, light emission does not leak between neighboring LED's 21.

In addition, since the block 6 is made from a metal material, it also has a function as a heat conducting portion for cooling heat generated by the LSI 22 through conducting it to the lid body 4. In FIG. 4, the block 6 is disposed so as to make intimate contact with the LSI 22 via a heat conducting sheet 36a at a part of the bottom surface. In addition, the block 6 is disposed so as to make intimate contact with the lid body 4 via a heat conducting sheet 36b at a part of the top surface. The heat conducting sheets 36a and 36b have a thickness of approximately 2 mm, which can be shrunk to approximately 1 mm when it is mounted, and absorb an error in arrangement of components so that the intimate contact can be secured.

Note that an insulating sheet 27 is disposed on the surface of the printed circuit board unit 5 between the printed circuit board unit 5 and the block 6.

As described above, the base station apparatus 1 has a waterproof construction that prevents water from entering inside the base station apparatus 1 and is connected to the optical cable 52, the AC power supply wiring cable, other wiring cables and the like. In order to realize the waterproof construction, the base station apparatus 1 has a plurality of lead-in holes 18 for the cables on the bottom surface. The LSI 22 and other LSIs (not shown) are disposed at the vicinity of the lead-in holes 18 so as to process signals received through the optical cables 52. In addition, the LED 21 is disposed at the vicinity of the LSIs so as to display states of processed signals and input and/or output states of the signals. Note that as the LSI 22 and its peripheral LSIs, a CPU, a DSP, an A/D converter element, a memory element and a variety of other elements are used, for example.

The display panel 41 has the following structure for realizing the waterproof construction.

In FIG. 5, as described above, the lid body 4 is provided with the opening hole 17. The opening hole 17 is arranged to face the region AL of the printed circuit board unit 5 where the LED's 21 are arranged. The opening hole 17 has a larger area than the region AL so as to cover all the LED's 21 that are to be observed from the outside of the base station apparatus 1. In addition, the perimeter of the opening hole 17 is provided with recesses 19 and 20 formed like a stair with two steps in the depth direction.

The display panel 41 is made up of a seal member 42, a plate-like body 43, a pressing member 44 and screws 45.

The seal member 42 is formed in a rectangular frame shape and is like a sheet having adhesion. The seal member 42 is stuck to the recess 19 so as not to cover the opening hole 17.

The plate-like body 43 is made from transparent acrylic and is formed in a shape close to a rectangle. The plate-like body 43 is disposed in the recess 19 so as to sandwich the seal member 42 between the plate-like body 43 and the recess 19, and it covers the opening hole 17.

The pressing member 44 is made from a metal and is formed in a rectangular frame shape. The pressing member 44 is disposed in the recess 20 so as to contact the surface of the plate-like body 43, and it is attached to the lid body 4 with the screws 45 so as to press and hold the plate-like body 43.

Next, the block 6 will be described in more detail.

Figure 6:
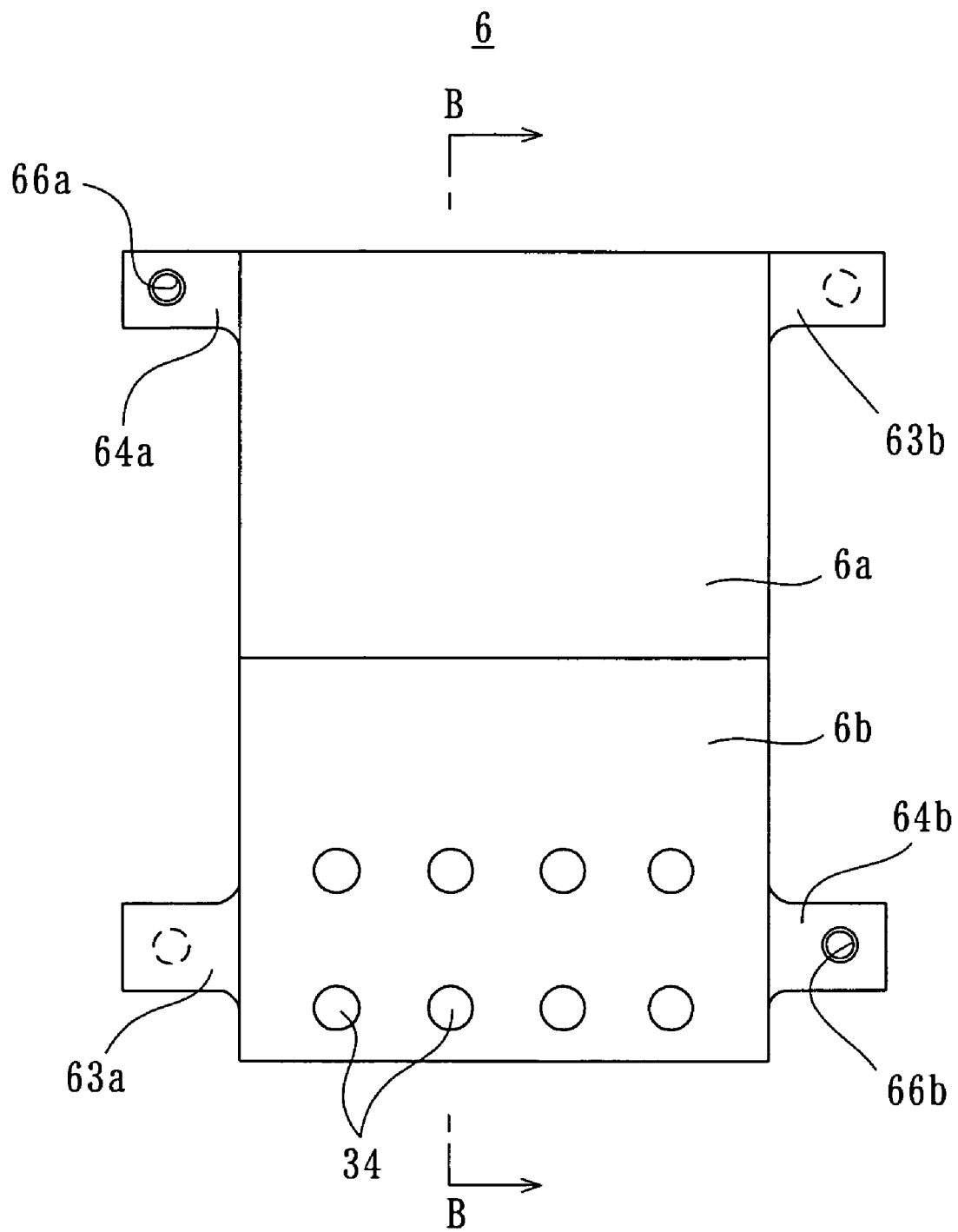
FIG. 6 is a front view of a block.
Figure 7:
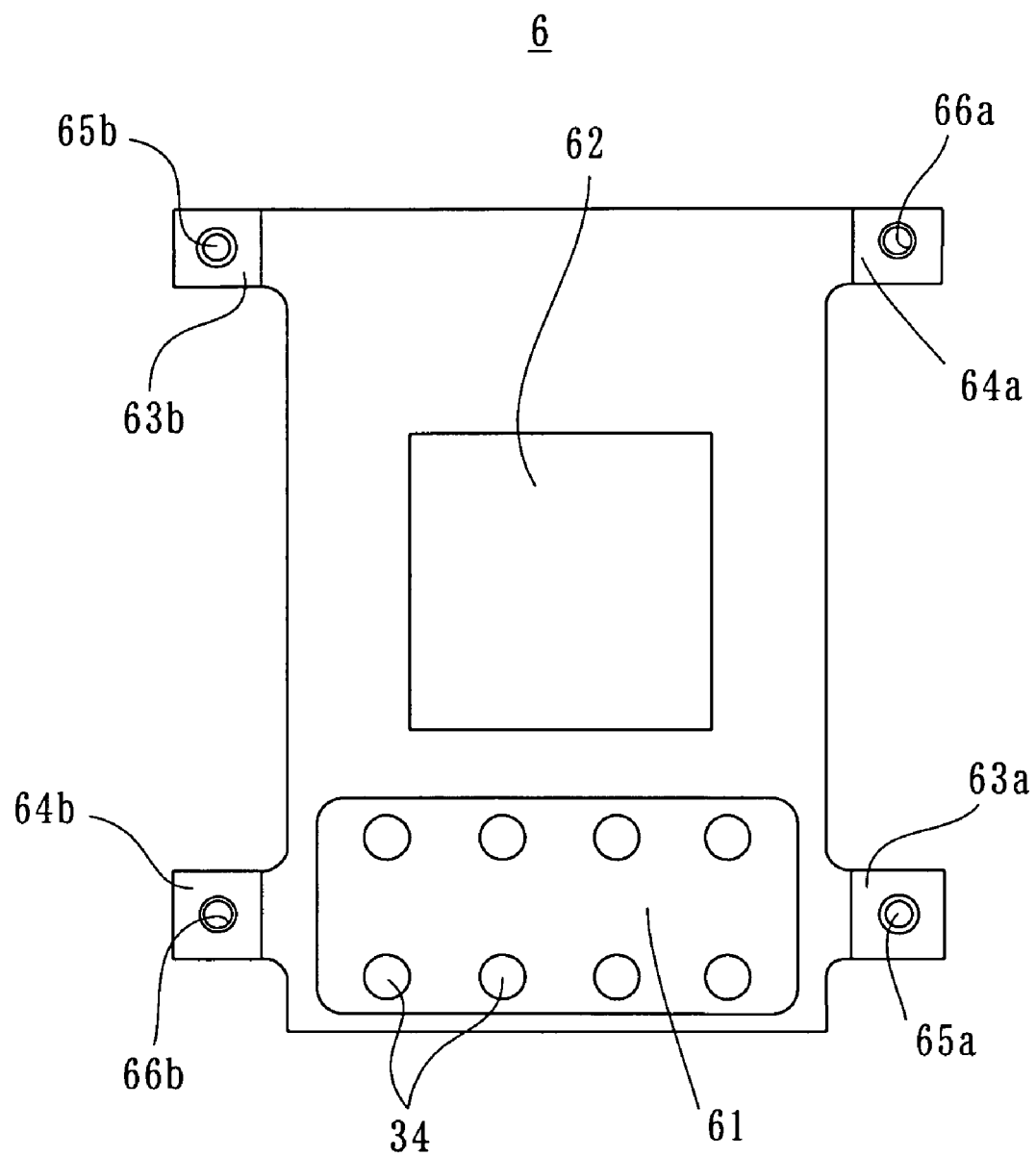
FIG. 7 is a rear view of the block.
Figure 8:
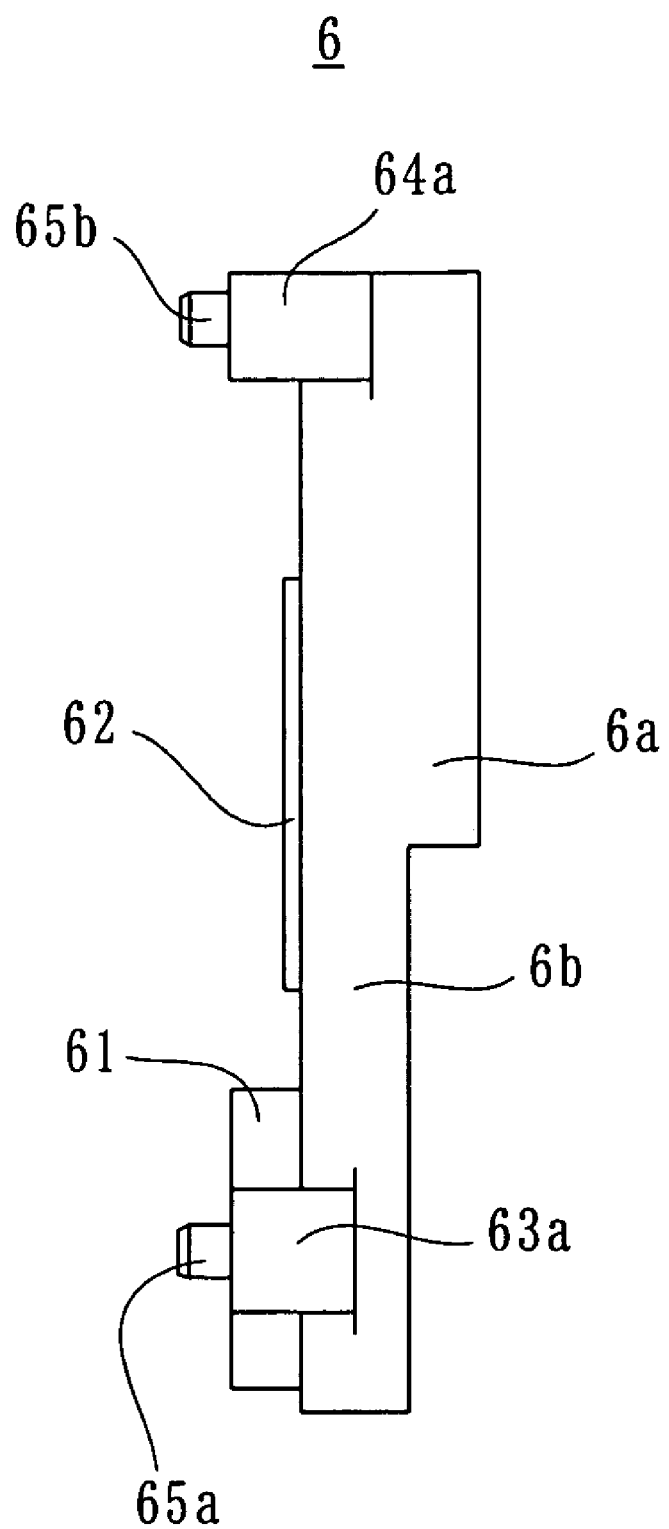
FIG. 8 is a left side view of the block.
Figure 9:
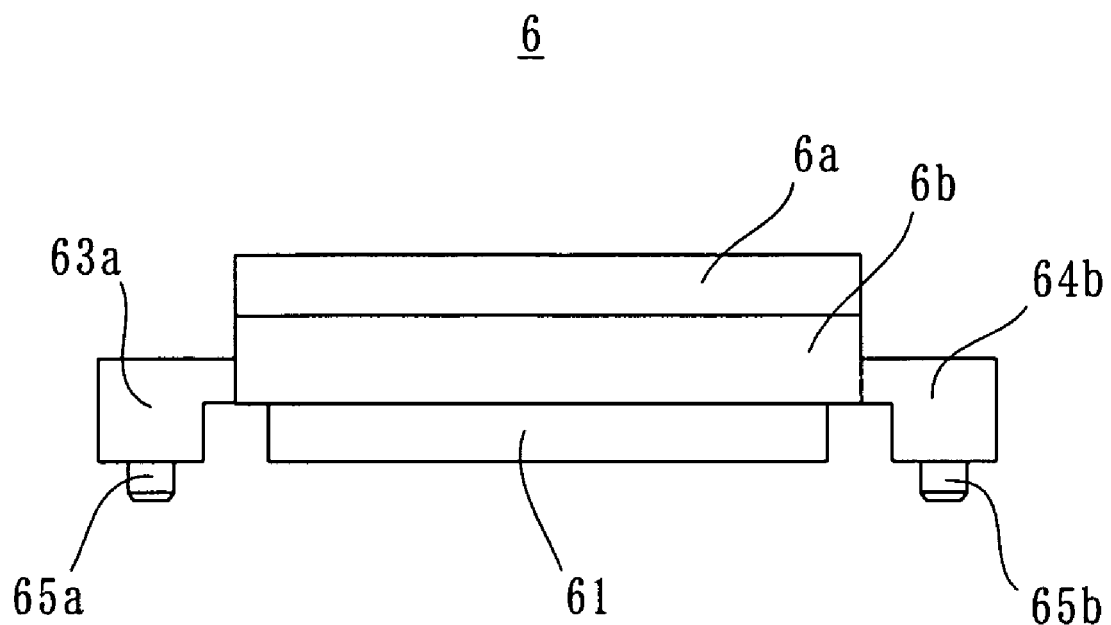
FIG. 9 is a bottom view of the block.
Figure 10:
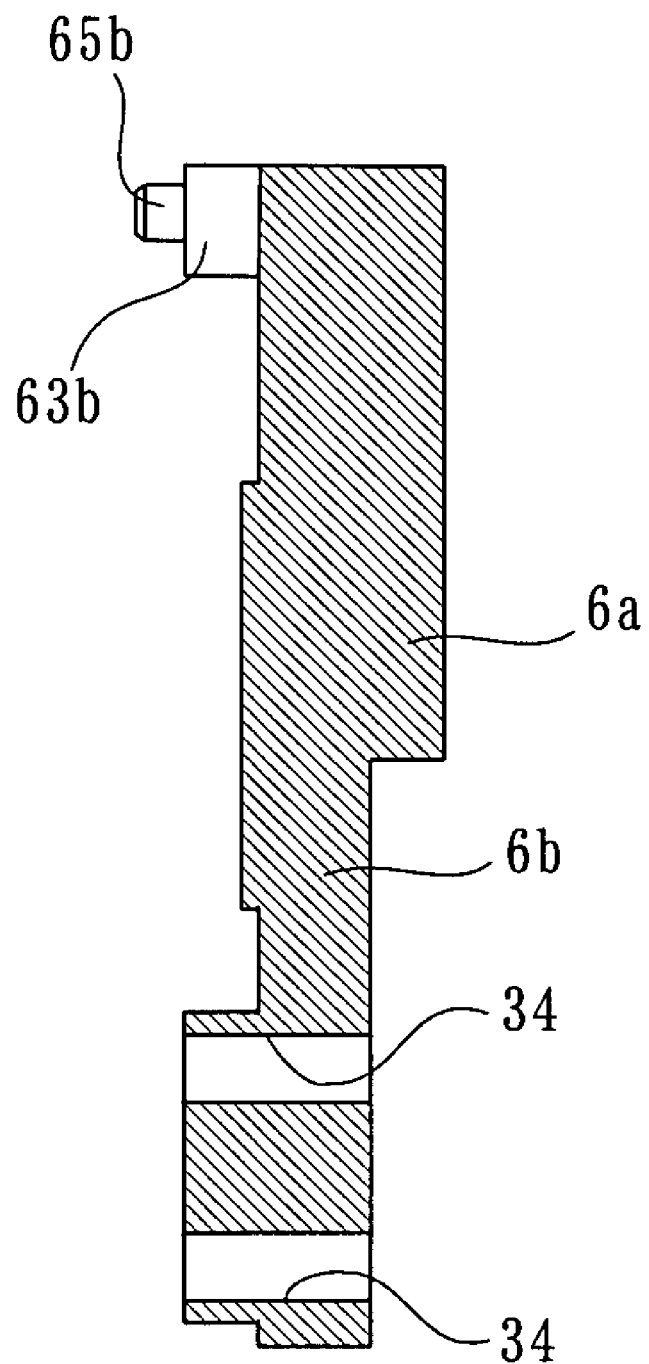
FIG. 10 is a cross section of the block shown in FIG. 6 cut along the line B-B.
Figure 11:
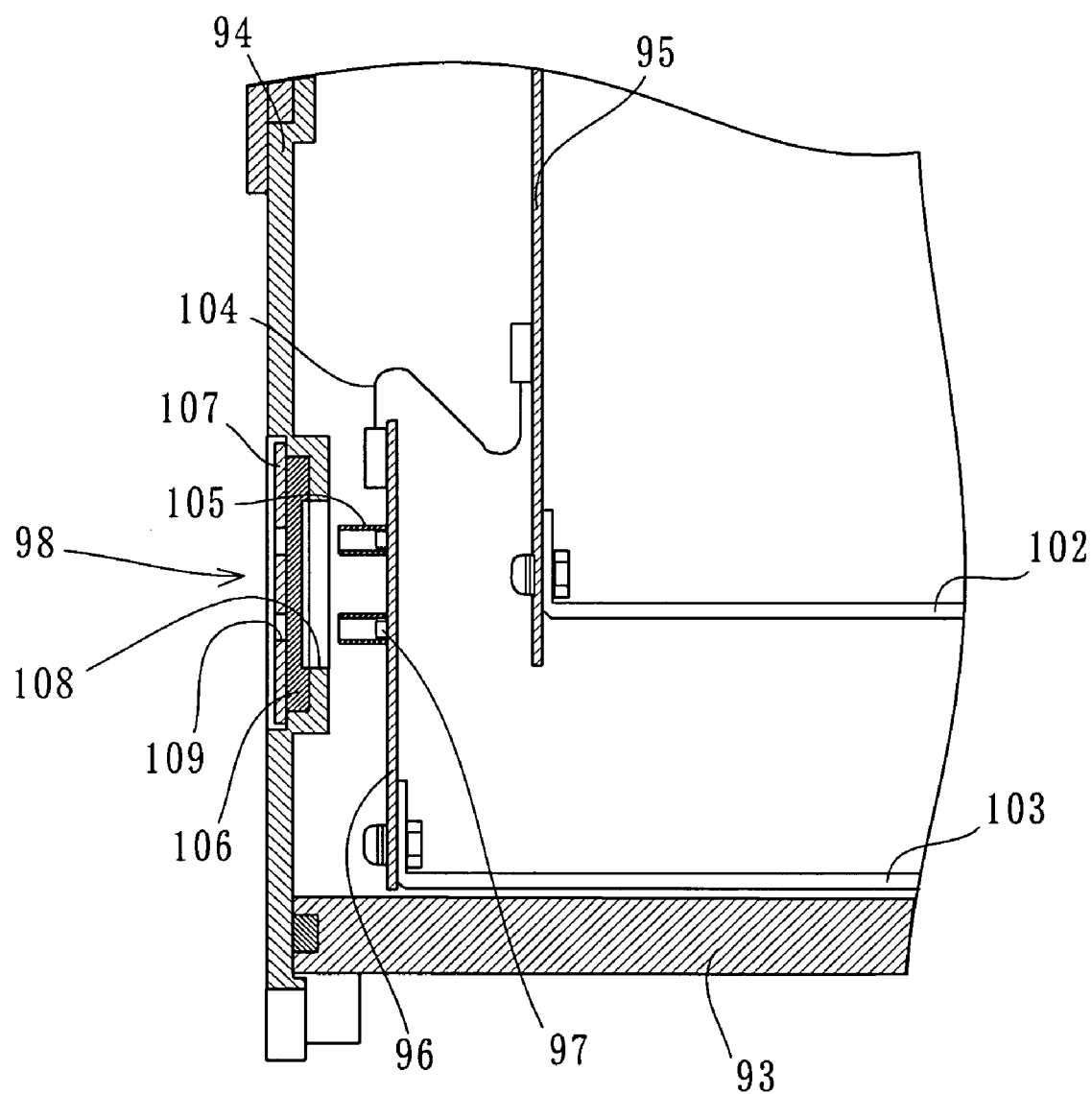
FIG. 11 is a perspective view showing inside of a conventional base station apparatus at a bottom and the vicinity, in which a lid body is removed.

FIG. 6 is a front view of the block 6, FIG. 7 is a rear view of the block 6, FIG. 8 is a left side view of the block 6, FIG. 9 is a bottom view of the block 6, and FIG. 10 is a cross section of the block 6 cut along the line B-B in FIG. 6.

In FIGS. 6-10, the block 6 is formed in a shape with a step provided at the surface for avoiding interference with the inside portion of the recesses 19 and 20 provided at the lid body 4 (see FIG. 5). In other words, the block 6 has an integrated shape of a substantially block-like heat conducting portion 6a and a substantially block-like light transmitting portion 6b that is a little smaller than the heat conducting portion 6a. The block 6 has salient portions 61 and 62 on the bottom surface and four leg portions 63a, 63b, 64a and 64b protruding from the side faces.

The block 6 has eight holes 34 that pass through from the surface to the bottom face in the light transmitting portion 6b. Although the number of LED's 21 and holes 34 is eight each in the present embodiment, the number of them can be any number. The shape and the size of the holes 34 are not limited as long as the holes 34 can receive the LED's 21.

In FIG. 7, the salient portion 61 has substantially the same area of the surface as the region AL, and it is disposed so as to cover all the holes 34. The salient portion 61 covers the LED's 21 when the block 6 is fixed to the printed circuit board unit 5 for use, and it has substantially intimate contact with the printed circuit board unit 5, so as to prevent leak of light from the LED 21 to neighboring LED's 21 and others.

The salient portion 62 has intimate contact with the LSI 22 via the heat conducting sheet 36a when the block 6 is fixed to the printed circuit board unit 5 for use.

The leg portions 63a and 63b are provided with boss portions 65a and 65b, respectively. The leg portions 64a and 64b are provided with threaded holes 66a and 66b, respectively.

The block 6 is positioned by the boss portions 65a and 65b that fit in boss receiving holes (not shown) respectively provided at the printed circuit board unit 5. The block 6 is fixed to the printed circuit board unit 5 by screws 67 that engage the threaded holes 66a and 66b.

As described above, the base station apparatus 1 according to the present invention does not need the plastic component for preventing diffusion of light, the sub circuit board unit and the peripheral components that are used in the conventional base station apparatus. For this reason, the number of components of the base station apparatus can be reduced, and cost for the components can be reduced. In addition, since the number of components is reduced, the number of man-hours for assembling and position adjustment can be reduced.

In addition, adjustment of registration between positions of small holes provided for the LED's on the surface of the base station apparatus and positions of the LED's was inevitable in the conventional base station apparatus. In contrast, the base station apparatus 1 according to the present invention only requires that the region on the printed circuit board unit where the plurality of LED's are arranged is within the opening hole provided at the lid body or the frame of the pressing member of the display panel. In addition, even if a little misregistration occurs between components, there is no problem in visibility of light emission of the LED's. For this reason, adjustment of registration between the components is almost unnecessary. For example, a work such as removing the closed lid body 4 and reattaching the same after readjustment of registration like the conventional apparatus becomes unnecessary, so that the number of man-hours for adjustment of registration can be reduced.

In addition, since light from the LED is guided by the block 6, a change of distance between a mounting position of the LED and the display panel 41 can be easily supported by changing a size of the block 6 in accordance with the change of distance. Thus, flexibility in design can be improved.

In addition, the block of the base station apparatus 1 according to the present invention also has a function as the heat conducting portion. Therefore, both guiding of light from the LED's and cooling of the LSI can be performed simultaneously in a small space. Since the heat conducting portion 6a and the light transmitting portion 6b are formed as one unit, heat radiation effect thereof is higher than that of the conventional heat conducting portion that is formed as a separate unit. Thus, the heat radiation characteristic (heat transmission characteristic) is improved.

Although total four of the leg portions 63 and 64 of the block 6 are provided in the present embodiment, the number of leg portions can be any number as long as the block 6 can be positioned and fixed, and as long as it can be positioned, on the surface of the printed circuit board unit 5, to avoid other circuits, components and the like.

In the embodiment described above, the structure, the shape, the size, the number, the material and the like of the cabinet body, the lid body, the printed circuit board unit, the fin, the screw, the rubber packing, the mounting bracket, the seal member, the plate-like body, the pressing member, or other part or the whole of the base station apparatus can be modified if necessary in accordance with the spirit of the present invention.

In addition, the present invention can be applied to an electronic apparatus having any shape and structure provided with LED's.

Although the embodiment of the present invention is described above, the present invention can be embodied variously without limiting to the embodiment described above.

While example embodiments of the present invention have been shown and described, it will be understood that the present invention is not limited thereto, and that various changes and modifications may be made by those skilled in the art without departing from the scope of the invention as set forth in the appended claims and their equivalents.

What is claimed is:

1. An electronic apparatus that is installed outdoors for use, comprising:
   a cabinet body having an open plane and an opening that houses components constituting the electronic apparatus;
   a printed circuit board unit having a surface thereof on which a semiconductor integrated circuit element for performing control of the electronic apparatus is mounted, the surface including a light emitting region in which a plurality of light emitting diodes of surface-mounting type indicating an operation state of the electronic apparatus being surface-mounted, and the printed circuit board unit being disposed in the cabinet body so that a surface of the printed circuit board unit faces the open plane;
   a lid body that includes a first face exposed outside, a second face opposite to the first face, and a window portion disposed in a position facing the light emitting region and covered with a transparent material having an area larger than an area of the light emitting region, the lid body closing the opening; and
   a block that is made from a metal material, provided with a plurality of holes penetrating through the block and individually corresponding to the plurality of light emitting diodes, disposed between the printed circuit board unit and the second face of the lid body, and provided integrally with a heat conducting sheet making intimate contact with a surface of the semiconductor integrated circuit element and a portion of the second face of the lid body excluding the window portion such that heat generated by the semiconductor integrated circuit element is conducted to the lid body for cooling, wherein
   the plurality of holes provided in the block are for viewing light individually emitted by the plurality of light emitting diodes from outside of the electronic apparatus through the plurality of holes and the window portion.

2. The electronic apparatus according to claim 1, wherein the block is provided with a label indicating contents of display of the plurality of light emitting diodes at a position that can be viewed through the window portion from the outside of the electronic apparatus.

3. The electronic apparatus according to claim 1, wherein the electronic apparatus is configured to prevent water from entering inside the electronic apparatus.

4. The electronic apparatus according to claim 1, wherein the electronic apparatus has a lead-in hole for a wiring cable for sending and receiving a signal to and from outside the electronic apparatus, and the plurality of light emitting diodes and the semiconductor integrated circuit element are disposed close to the lead-in hole so as to deal with the signal received through the wiring cable.

5. The electronic apparatus according to claim 3, wherein the window portion has a seal member for preventing water from entering, a plate-like body made from the transparent material and a frame-like pressing member,
   the seal member is disposed around an opening hole provided at the lid body,
   the plate-like body covers the opening hole so as to sandwich the seal member between the plate-like body and the lid body, and
   the pressing member is disposed to contact a surface of the plate-like body and is attached to the lid body with screws so as to press and hold the plate-like body.

6. The electronic apparatus according to claim 1, wherein the block has a leg portion to which a boss portion is provided and a leg portion to which a threaded hole is provided, and the boss portion fits in a boss receiving hole that is provided at the printed circuit board unit for registration, and a predetermined screw engages the threaded hole for fixing to the printed circuit board unit.

* * * * *